United States Patent
Huang et al.

(10) Patent No.: US 6,338,976 B1
(45) Date of Patent: Jan. 15, 2002

(54) METHOD FOR FORMING OPTOELECTRONIC MICROELECTRONIC FABRICATION WITH ATTENUATED BOND PAD CORROSION

(75) Inventors: Chieh-Chuan Huang, San Jose, CA (US); Cheng-Yu Chu; Shun-Liang Hsu, both of Hsin-Chu (TW)

(73) Assignee: Taiwan Semiconductor Manufacturing Company, Ltd., Hsin Chu (TW)

( * ) Notice: Subject to any disclaimer, the term of this patent is extended or adjusted under 35 U.S.C. 154(b) by 0 days.

(21) Appl. No.: 09/489,462

(22) Filed: Jan. 21, 2000

(51) Int. Cl.[7] .................. H01L 21/00; H01L 21/44; C11D 9/04
(52) U.S. Cl. ................... 438/48; 438/617; 510/176
(58) Field of Search .................. 438/48, 50, 98, 438/57, 952, 953, 611; 349/110; 510/176

(56) References Cited

U.S. PATENT DOCUMENTS

| | | | |
|---|---|---|---|
| 4,205,099 A | * 5/1980 | Jones et al. | ............ 427/90 |
| 4,491,530 A | 1/1985 | Thomas | |
| 5,250,471 A | * 10/1993 | Kogure et al. | ............ 437/225 |
| 5,376,235 A | 12/1994 | Langley | |
| 5,380,401 A | 1/1995 | Jones et al. | |
| 5,392,371 A | * 2/1995 | Nishida et al. | ............ 359/66 |
| 5,461,008 A | 10/1995 | Sutherland et al. | |
| 5,644,371 A | * 7/1997 | Koden et al. | ............ 349/110 |
| 5,665,423 A | * 9/1997 | Lee | ............ 438/88 |
| 5,686,162 A | 11/1997 | Polak et al. | |
| 6,153,043 A | * 11/2000 | Edelstein et al. | ............ 156/345 |

FOREIGN PATENT DOCUMENTS

| | | | | |
|---|---|---|---|---|
| JP | 405152268 A | * 12/1991 | | ............ 438/694 |
| JP | 40515226-8 A | * 6/1993 | | |

* cited by examiner

*Primary Examiner*—John F. Niebling
*Assistant Examiner*—Viktor Simkovic
(74) *Attorney, Agent, or Firm*—Tung & Associates

(57) ABSTRACT

Within a method for fabricating an microelectronic fabrication there is first provided a substrate employed within an optoelectronic microelectronic fabrication, where the substrate comprises an optoelectronic microelectronic device which is in electrical communication with a bond pad formed over the substrate. There is then processed, when fabricating the substrate to form the optoelectronic microelectronic fabrication, the substrate in the absence of optoelectronically transducable radiation, in order to attenuate corrosion of the bond pad. The method is particularly useful for forming a color filter sensor image array optoelectronic microelectronic fabrication comprising multiple photoresist based patterned colored filter layers.

14 Claims, 1 Drawing Sheet

METHOD FOR FORMING OPTOELECTRONIC MICROELECTRONIC FABRICATION WITH ATTENUATED BOND PAD CORROSION

BACKGROUND OF THE INVENTION

1. Field of the Invention

The present invention relates generally to optoelectronic microelectronic fabrications. More particularly, the present invention relates to methods for fabricating optoelectronic microelectronic fabrications with attenuated bond pad corrosion.

2. Description of the Related Art

Microelectronic fabrications are formed microelectronic substrates over which are formed patterned microelectronic conductor layers which are separated by microelectronic dielectric layers.

Known within the art of microelectronic fabrication are purely electronic microelectronic fabrications whose operation is based solely upon electrical signal storage and processing characteristics of purely electronic microelectronic devices and microelectronic circuits formed upon a microelectronic substrate. Examples of such purely electronic microelectronic fabrications typically include, but are not limited to, semiconductor integrated circuit microelectronic fabrications and ceramic substrate microelectronic fabrications. Similarly, also known within the art of microelectronic fabrication are microelectronic fabrications whose operation is based upon a codependent transduction, storage and/or processing of optical and electrical signals while employing optoelectronic microelectronic devices formed upon a microelectronic substrate. Examples of such optoelectronic microelectronic fabrications typically include, but are not limited to: (1) solar cell optoelectronic microelectronic fabrications; and (2) image array optoelectronic microelectronic fabrications such as but not limited to: (a) sensor image array optoelectronic microelectronic fabrications; and (b) display image array optoelectronic microelectronic fabrications.

Common to all microelectronic fabrications, whether purely electronic microelectronic fabrications or optoelectronic microelectronic fabrications, is the use of bond pads as a means for connecting and interconnecting the microelectronic fabrications into useful microelectronic products.

While the use of bond pads for connecting and interconnecting microelectronic fabrications into useful microelectronic products is quite common in the art of microelectronic fabrication, the use of bond pads when connecting and interconnecting microelectronic fabrications into useful products is not entirely without problems in the art of microelectronic fabrication.

In that regard, incident to their exposure to various microelectronic fabrication processes, bond pads are often corroded, eroded, stained or otherwise degraded when fabricating microelectronic fabrications. Although various mechanisms may provide such corroded, eroded, stained or otherwise degraded bond pads, within the context of the present invention the terminology "corrosion" or "corroded" is intended to include physical and/or electrical performance degradation of a bond pad formed within a microelectronic fabrication, irrespective of the actual mechanism through which such physical or electrical performance degradation actually occurs. Corroded bond pads are undesirable in the art of microelectronic fabrication since it is often difficult to form fully functional or reliable electrical connections to corroded bond pads.

It is thus towards the goal of providing methods and materials for forming within microelectronic fabrications bond pads with attenuated corrosion that the present invention is most generally directed. More particularly, it is also towards the goal of providing methods and materials for forming within optoelectronic microelectronic fabrication bond pads with attenuated corrosion that the present invention is more specifically directed.

Various methods and materials have been disclosed in the art of microelectronic fabrication for forming bond pads with desirable properties.

For example, Thomas, in U.S. Pat. No. 4,491,530, discloses a phenol free and chlorinated hydrocarbon free photoresist stripper composition which may be employed for stripping photoresist layers from microelectronic fabrications while avoiding staining of bond pads which are exposed to the photoresist stripper composition. In conjunction with the absence of phenol and the chlorinated hydrocarbon, the photoresist stripper composition comprises: (1) a surfactant alkylarylsulfonic acid having from twelve to twenty carbon atoms; (2) a hydrotrophic aromatic sulfonic acid having from six to nine carbon atoms; (3) an aromatic hydrocarbon solvent with a boiling point above 150 degrees centigrade; and (4) a substantially water soluble sulfone material.

In addition, Langley, in U.S. Pat. No. 5,376,235, discloses a method for attenuating corrosion of a patterned conductor layer, such as but not limited to a bond pad, within a microelectronic fabrication. The method provides for rinsing the patterned conductor layer with a chromium free dilute phosphoric acid solution in order to remove chlorine contaminants, fluorine contaminants and residual oxide contaminants which would otherwise facilitate corrosion of the patterned conductor layer.

Further, Jones et al., in U.S. Pat. No. 5,380,401, similarly also discloses a method for removing from a bond pad fluorine contaminants and residual oxide contaminants which would otherwise provide the bond pad with an undesirably high contact resistance. The method is a reactive ion etch (RIE) plasma etch method which employs an etchant gas composition comprising argon and carbon dioxide for cleaning from the bond pad the fluorine contaminants and the residual oxide contaminants.

Still further, Sutherland et al., in U.S. Pat. No. 5,461,008, discloses a method for attenuating corrosion of a bond pad within a semiconductor integrated circuit microelectronic fabrication die incident to dicing a semiconductor substrate to form the semiconductor integrated circuit microelectronic fabrication die. The method provides for incorporating into an aqueous coolant medium employed for cooling a dicing saw blade employed for dicing the semiconductor substrate an organic acid at a concentration which provides the aqueous coolant medium with a pH of less than about 5.5. At such pH corrosive silicon particles formed incident to dicing the semiconductor substrate are less adherent to the bond pad.

Finally, Polak et al., in U.S. Pat. No. 5,686,162, discloses a method for attenuating corrosion of electrical components formed within a microelectronic fabrication, such as corrosion of a bond pad formed within the microelectronic fabrication, when encapsulating the microelectronic fabrication with an organic polymer encapsulant material. The method provides for incorporating into the organic polymer encapsulant material a buffer material which neutralizes the effect of a corrosive material which would otherwise corrode the electrical components.

Desirable in the art of microelectronic fabrication are additional methods and materials which may be employed for attenuating corrosion of a bond pad formed within a microelectronic fabrication. More particularly desirable in the art of optoelectronic microelectronic fabrication are additional methods and materials which may be employed for attenuating corrosion of a bond pad formed within an optoelectronic microelectronic fabrication.

It is towards the foregoing objects that the present invention is both generally and more specifically directed.

SUMMARY OF THE INVENTION

A first object of the invention is to provide a method for attenuating corrosion of a bond pad formed within the microelectronic fabrication.

A second object of the present invention is to provide a method in accord with the first object of the present invention, where the microelectronic fabrication is an optoelectronic microelectronic fabrication.

A third object of the present invention is to provide a method in accord with the first object of the present invention and the second object of the present invention, where the method is readily commercially implemented.

In accord with the objects of the present invention, there is provided by the present invention a method for fabricating a microelectronic fabrication. To practice the method the method of the present invention, there is first provided a substrate employed within an optoelectronic microelectronic fabrication. Within the present invention, the substrate comprises an optoelectronic device electrically connected with a bond pad formed over the substrate. Finally, when fabricating the substrate to form the optoelectronic microelectronic fabrication, the substrate is processed in the absence of radiation which is optoelectronically transducable by the optoelectronic device, in order to attenuate corrosion of the bond pad.

The present invention provides a method for attenuating corrosion of a bond pad formed within a microelectronic fabrication, where the microelectronic fabrication is an optoelectronic microelectronic fabrication. The present invention realizes the foregoing object when forming an optoelectronic microelectronic fabrication from a substrate comprising an optoelectronic device electrically connected with a bond pad formed over the substrate, by processing the substrate in the absence of radiation which is optoelectronically transducable by the optoelectronic device, in order to attenuate corrosion of the bond pad. Thus, by processing the substrate in the absence of radiation which is optoelectronically transducable by the optoelectronic device, there is attenuated charge formation at the bond pad. Such charge formation would otherwise contribute to corrosion of the bond pad.

The method of the present invention is readily commercially implemented. The present invention employs an optoelectronic microelectronic fabrication apparatus modification and process control which are readily implemented and adapted to the art of optoelectronic microelectronic fabrication. Since the present invention is predicated at least in part upon the recognition of a mechanism through which bond pad corrosion may occur and may be attenuated, rather than predicated upon the existence of methods and materials, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for attenuating corrosion of a bond pad formed within a microelectronic fabrication, where the microelectronic fabrication is an optoelectronic microelectronic fabrication. The present invention realizes the foregoing object when forming an optoelectronic microelectronic fabrication from a substrate comprising an optoelectronic device in electrical communication with a bond pad formed over the substrate, by processing the substrate in the absence of radiation which is optoelectronically transducable by the optoelectronic device, to attenuate corrosion of the bond pad. Similarly, by processing the substrate in the absence of radiation which is optoelectronically transducable by the optoelectronic device, there is attenuated an electrical charge formation at the bond pad. The electrical charge formation would otherwise contribute to corrosion of the bond pad.

The method of the present invention may be employed for forming, with attenuated corrosion, bond pads formed within optoelectronic microelectronic fabrications including but not limited to solar cell optoelectronic microelectronic fabrications, sensor (such as sensor image array) optoelectronic microelectronic fabrications (such as but not limited to color filter sensor image array optoelectronic microelectronic fabrications and non color filter sensor image array optoelectronic microelectronic fabrications) and display (such as display image array) optoelectronic microelectronic fabrications.

Figure 1:
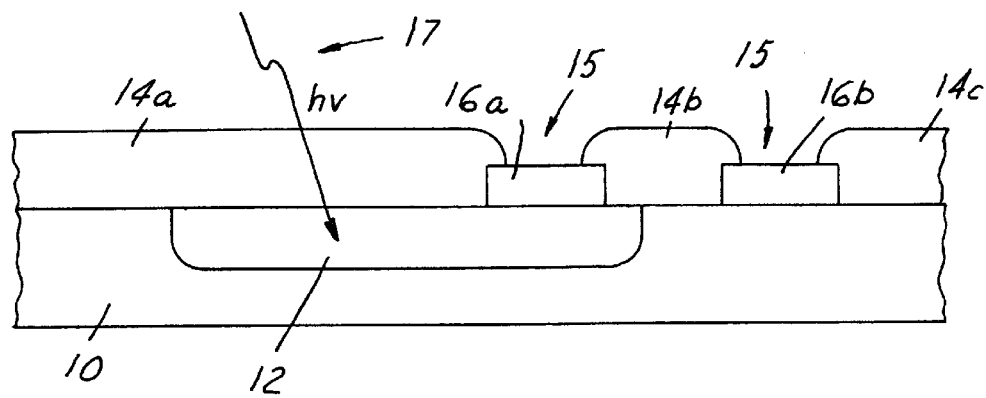
FIG. 1, FIG. 2 and FIG. 3 show a series of schematic cross-sectional diagrams illustrating the results of progressive stages in fabricating a portion of a color filter sensor image array optoelectronic microelectronic fabrication in accord with a preferred embodiment of the present invention.
Figure 2:
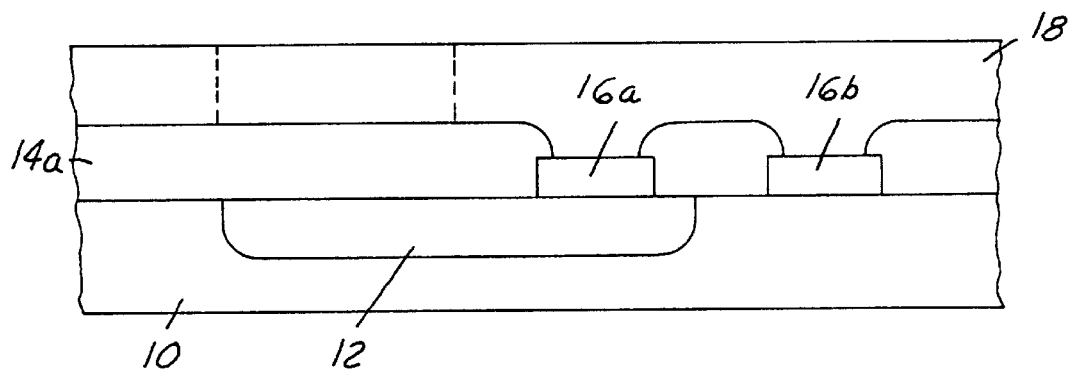
Figure 3:
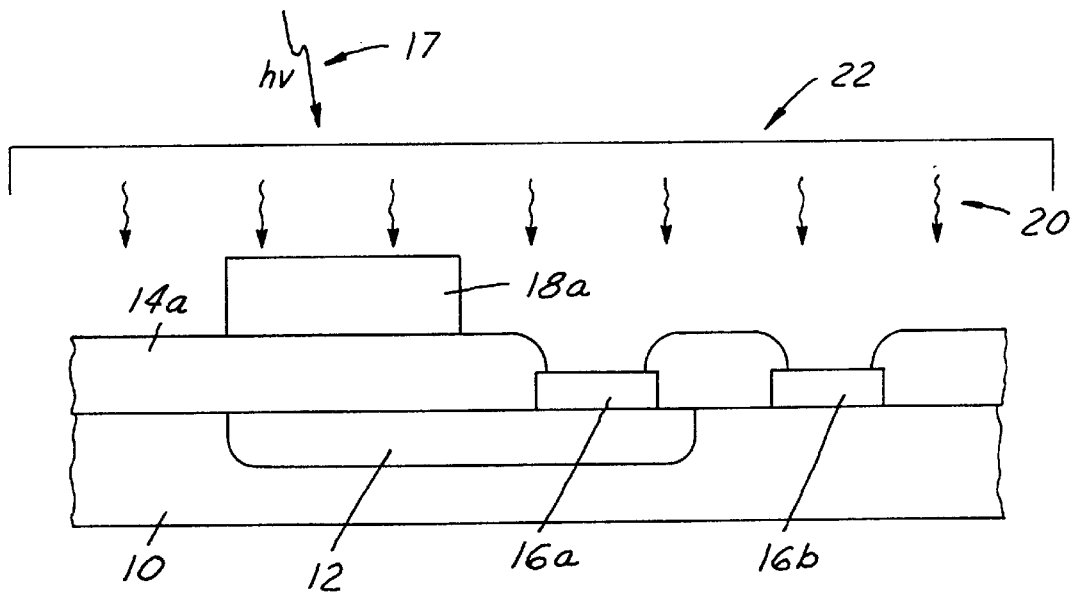

Referring now to FIG. 1 to FIG. 3, there is shown a series of schematic cross-sectional diagrams illustrating the results of progressive stages in forming a portion of a color filter sensor image array optoelectronic microelectronic fabrication in accord with a preferred embodiment of the present invention.

Shown in FIG. 1 is a schematic cross-sectional diagram of the portion of the color filter sensor image array optoelectronic microelectronic fabrication at an early stage in its fabrication in accord with the preferred embodiment of the present invention.

Shown in FIG. 1, in a first instance, is a semiconductor substrate 10 having formed therein a doped region 12. In addition, there is also shown in FIG. 1 formed upon a portion of the doped region 12 of the semiconductor substrate 10 a first bond pad 16a, and formed upon the semiconductor substrate 10 at a location other than upon the doped region 12 of the semiconductor substrate 10 a second bond pad 16b. Finally, there is also shown in FIG. 1 formed upon the semiconductor substrate 10 and passivating a pair of opposite edges of the first bond pad 16a and the second bond pad 16b a series of patterned passivation dielectric layers 14a, 14b and 14c. The series of patterned passivation dielectric layers 14a, 14b and 14c defines a pair of vias 15, one of which accesses an upper surface of the first bond pad 16a and the other of which accesses an upper surface of the second bond pad 16b. Within the preferred embodiment of the present invention, each of the foregoing semiconductor substrate 10, doped region 12, patterned passivation dielectric layers 14a, 14b and 14c, first bond pad 16a and second bond pad 16b may be formed employing methods and materials as are conventional in the art of optoelectronic microelectronic fabrication. Similarly, although the color filter sensor image array optoelectronic microelectronic fabrication whose schematic cross-sectional diagram is illustrated in FIG. 1 illustrates the first bond pad 16a as being formed upon a portion of the doped region 12 of the semiconductor substrate 10 and the second bond pad 16b as being formed upon a portion of the semiconductor substrate 10 other than the doped region 12 of the semiconductor substrate 10, in a broader sense, the present invention is operative when a bond pad, such as the first bond pad 16a or the second bond pad 16b, electrically communicates with an optoelectronic device, such as is formed within or by the doped region 12 within the semiconductor substrate 10.

Within the preferred embodiment of the present invention with respect to the semiconductor substrate 10, although the semiconductor substrate 10 may be formed from any of several semiconductor materials from which may be fabricated an optoelectronic microelectronic device fabricated within the semiconductor substrate, including but not limited to silicon semiconductor materials, gallium arsenide semiconductor materials and other compound semiconductor materials, typically and preferably, the semiconductor substrate 10 is formed from a silicon semiconductor material formed from any of several crystallographic orientations which may be employed when forming optoelectronic microelectronic devices while employing silicon semiconductor materials. Such crystallographic orientations may include, but are not limited to (100) crystallographic orientations, (110) crystallographic orientations and (111) crystallographic orientations. Similarly, although the silicon semiconductor material which is employed for forming the semiconductor substrate 10 may be formed employing either dopant polarity and any of several dopant concentrations, for the preferred embodiment of the present invention the silicon semiconductor material from which is formed the semiconductor substrate 10 typically and preferably has an N− dopant polarity. Although any of several methods and materials may be employed for providing the silicon semiconductor material with the N− doping, the silicon semiconductor material is typically and preferably provided with the N− doping either intrinsically within an ingot from which is sliced the semiconductor substrate 10, or by thermal diffusion after slicing the semiconductor substrate 10 from the ingot.

In addition, within the preferred embodiment of the present invention with respect to the doped region 12, the doped region 12 is typically and preferably formed as a P+ doped region, typically and preferably formed employing a boron dopant.

Further, within the preferred embodiment of the present invention with respect to the first bond pad 16a and the second bond pad 16b, although the first bond bad 16a and the second bond pad 16b may be formed from any of several conductor materials as are conventional in the art of microelectronic fabrication, including but not limited to metals, metal alloys, doped polysilicon (having a dopant concentration of greater than about 1E18 dopant atoms per cubic centimeter) and polycide (doped polysilicon/metal silicide stack) conductor materials, the present invention provides particular value when each of the first bond pad 16a and the second bond pad 16b is formed at least in part of an aluminum conductor material, an aluminum alloy conductor material, a copper conductor material or a copper alloy conductor material of at least about 75 weight percent aluminum or copper, as appropriate, and more preferably from about 90 to about 95 weight percent aluminum or copper, as appropriate. Typically and preferably, each of the first bond pad 16a and the second bond pad 16b is formed to a thickness of from about 7500 to about 9500 angstroms.

Finally, within the preferred embodiment of the present invention with respect to the series of patterned passivation dielectric layers 14a, 14b and 14c, the series of patterned passivation dielectric layers 14a, 14b and 14c may be formed from any of several passivation dielectric materials as are conventional in the art of microelectronic fabrication, provided that the series of patterned passivation dielectric layers 14a, 14b and 14c is sufficiently transparent to a wavelength of a dose of optoelectronically transducable radiation whose detection and quantification is desired to be effected while employing the portion of the color filter sensor image array optoelectronic microelectronic fabrication whose schematic cross-sectional diagram is illustrated in FIG. 1.

To effect the foregoing result, the series of patterned dielectric passivation layers 14a, 14b and 14c will typically and preferably be formed of a dielectric material selected from the group including but not limited to silicon oxide dielectric materials, silicon nitride dielectric materials and silicon oxynitride dielectric materials, formed to a thickness of from about 12000 to about 18000 angstroms each, although other methods and materials may be employed for forming the series of patterned passivation dielectric layers 14a, 14b and 14c. Typically and preferably, the series of patterned passivation dielectric layers 14a, 14b and 14c will define the pair of vias 15 of bidirectional linewidth from about 60 to about 100 microns exposing a portion of the upper surface of the first bond pad 16a and a portion of the upper surface of the second bond pad 16b.

Finally, there is also shown within the schematic cross-sectional diagram of FIG. 1 a dose of optoelectronically transducable radiation 17 whose detection and quantification is desired to be effected while employing the color filter sensor image array optoelectronic microelectronic fabrication whose schematic cross-sectional diagram is illustrated in FIG. 1. As is illustrated within the schematic cross-sectional diagram of FIG. 1, the dose of optoelectronically transducable radiation 17 is incident upon the doped region 12 at a location other than covered by the first bond pad 16a. Similarly, as is understood by a person skilled in the art, within the color filter sensor image array optoelectronic microelectronic fabrication whose schematic cross-sectional diagram is illustrated in FIG. 1 the doped region 12 and the substrate 10 form a photodiode, where a first portion of the photodiode is contacted by (or at least in electrical communication with (i.e., electrically connected to)) the first bond pad 16a and a second portion of the photodiode is contacted by (or at least in electrical communication with (i.e., electrically connected to)) the second bond pad 16b. Within the present invention, a dose of optoelectronically transducable radiation, such as the dose of optoelectronically transducable radiation 17, will typically and preferably be of wavelength in the visible region, although within the present invention in general the dose of optoelectronically transducable radiation may be of wavelength from any of several radiation regions. Within the preferred embodiment of the present invention, the dose of optoelectronically transducable radiation 17 will typically and preferably be of multi-wavelength in the visible region.

Within the context of the preferred embodiment of the present invention, when the doped region 12 is formed of P+ doping and at least a portion of the substrate 10 other than the doped region 12 is formed of N– doping, upon incidence of the dose of optoelectronically transducable radiation 17 upon the doped region 12 and the junction between the doped region 12 and the substrate 10 an electron-hole pair is generated. Within the presence of a conductive pathway between the first bond pad 16a and the second bond pad 16b, the electron-hole pair provides a flow of electrons from the first bond pad 16a into the doped region 12, and a corresponding electrical current flow in a reverse direction.

No electrical current will flow when the first bond pad 16a is electrically isolated from the second bond pad 16b. However, upon: (1) illumination of the doped region 12 and the junction between the doped region 12 and the substrate 10 with the dose of optoelectronically transducable radiation 17, in conjunction with; (2) immersion of the color filter sensor image array optoelectronic microelectronic fabrication whose schematic cross-sectional diagram is illustrated within FIG. 1 within any of various nominally electrically conductive wet chemicals or electrically conductive condensable vaporous or gaseous environments which may be employed for further fabrication of the color filter sensor image array optoelectronic microelectronic fabrication whose schematic cross-sectional diagram is illustrated in FIG. 1 (such nominally electrically conductive wet chemicals including but not limited to acids, bases, and photoresist developers), an electrical connection will be made between the first bond pad 16a and the second bond pad 16b. Such an electrical connection may provide for corrosion of the first bond pad 16a.

Given this newly recognized mechanistic source of bond pad corrosion within optoelectronic microelectronic fabrications, including but not limited to the color filter sensor image array optoelectronic microelectronic fabrication of the preferred embodiment of the present invention, it has thus been determined experimentally that bond pad corrosion within optoelectronic microelectronic fabrications may be inhibited when processing those optoelectronic microelectronic fabrications in the absence of optoelectronically transducable radiation under circumstances where the optoelectronic microelectronic fabrications are immersed within electrically conductive wet chemical environments or electrically conductive vaporous or gaseous environments which will otherwise facilitate corrosion of bond pads within optoelectronic microelectronic fabrications.

Referring now to FIG. 2, there is shown a schematic cross-sectional diagram illustrating the results of further processing of the color filter sensor image array optoelectronic microelectronic fabrication whose schematic cross-sectional diagram is illustrated in FIG. 1.

Shown in FIG. 2 is a schematic cross-sectional diagram of a color filter sensor image array optoelectronic microelectronic fabrication otherwise equivalent to the color filter sensor image array optoelectronic microelectronic fabrication whose schematic cross-sectional diagram is illustrated within FIG. 1, but wherein there is formed upon the series of patterned passivation dielectric layers 14a, 14b and 14c and the exposed portions of the first bond pad 16a and the second bond pad 16b within the pair of vias 15 a photoexposed blanket color filter layer 18.

Within the preferred embodiment of the present invention with respect to the photoexposed blanket color filter layer 18, the photoexposed blanket color filter layer 18 is typically and preferably formed of a photoresist material into which is incorporated a dye or pigment which is intended to filter and classify incoming multi-wavelength optoelectronically transducable radiation with respect to the photodiode which is comprised of the doped region 12 and the substrate 10. Typically and preferably, the dye or pigment incorporated into the photoresist material will be one of either: (1) a red, a green or a blue dye or pigment; or (2) a yellow, a cyan or a magenta dye or pigment. The photoresist material into which is incorporated the dye may be a photoresist material selected from the group of photoresist materials including but not limited to positive photoresist materials and negative photoresist materials.

Referring now to FIG. 3, there is shown a schematic cross-sectional diagram illustrating the results of further processing of the color filter sensor image array optoelectronic microelectronic fabrication whose schematic cross-sectional diagram is illustrated in FIG. 2.

Shown in FIG. 3 is a schematic cross-sectional diagram of a color filter sensor image array optoelectronic microelectronic fabrication otherwise equivalent to the color filter sensor image array optoelectronic microelectronic fabrication whose schematic cross-sectional diagram is illustrated in FIG. 2, but wherein the photoexposed blanket color filter layer 18 has been developed with a developer solution 20 to form a patterned color filter layer 18a. Within the preferred embodiment of the present invention, the developer solution 20 is an alkaline developer solution. As is similarly also illustrated within the schematic cross-sectional diagram of FIG. 3, when developing from the photoexposed blanket color filter layer 18 as illustrated within the schematic cross-sectional diagram of FIG. 2 the patterned color filter layer 18a as illustrated within the schematic cross-sectional diagram of FIG. 3 there is employed a radiation shield 22. The radiation shield is typically and preferably a light shield, sized to shield the color filter sensor image array optoelectronic microelectronic fabrication whose schematic cross-sectional diagram is illustrated in FIG. 3 from the dose of optoelectronically transducable radiation 17 which would otherwise effect corrosion of the first bond pad 16a.

In accord with the preferred embodiment of the present invention, by developing the photoexposed blanket color filter layer 18 as illustrated in FIG. 2 to form the patterned color filter layer 18a as is illustrated in FIG. 3, and for reasons as disclosed above within the context of the discussion of the color filter sensor image array optoelectronic microelectronic fabrication whose schematic cross-sectional diagram is illustrated in FIG. 1, the color filter sensor image array optoelectronic microelectronic fabrication whose schematic cross-sectional diagram is illustrated in FIG. 3 is formed with attenuated corrosion of the first bond pad 16a.

As is understood by a person skilled in the art, although the schematic cross-sectional diagrams of FIG. 1 to FIG. 3 illustrate a portion of a color filter sensor image array optoelectronic microelectronic fabrication comprising a photodiode comprised of the doped region 12 and the substrate 10, wherein the doped region 12 has formed thereupon the first bond pad 16a, a more complete color filter sensor image array optoelectronic microelectronic fabrication in accord with the preferred embodiment of the present invention is intended to comprise an areally bidirectional array of photodiodes comprising an areally bidirectional array of doped regions in conjunction with the substrate 10, wherein the areally bidirectional array of doped regions is electrically connected to an annular array of bond pads which surrounds the areally bidirectional array of doped regions.

Similarly, as is also understood by a person skilled in the art, there is employed in conjunction with the areally bidirectional array of photodiodes an areally bidirectional array of patterned color filter layers analogous to the patterned color filter layer 18a, wherein the areally bidirectional array of patterned color filter layers will typically and preferably be formed employing at least one more color in addition to the color from which is formed the patterned color filter layer 18a. In addition, as is also understood by a person skilled in the art, spacer layers and lensing layers will also be employed when forming from the color filter sensor image array optoelectronic microelectronic fabrication whose schematic cross-sectional diagram is illustrated in FIG. 3 a fully functional color filter sensor image array optoelectronic microelectronic fabrication.

Thus, as is finally also understood by a person skilled in the art, when fabricating the fully functional color filter sensor image array optoelectronic microelectronic fabrication from the color filter sensor image array optoelectronic microelectronic fabrication whose schematic cross-sectional diagram is illustrated in FIG. 3, there will also be employed multiple photoresist processing and development steps which employ photoresist processing and development materials which in the presence of optoelectronically transducable radiation will provide for corrosion of bond pads, such as the first bond pad 16a or the second bond pad 16b. Such photoresist processing and development materials may include (in addition to acids, bases, photoresist developers) photoresist adhesion promoters, such as but not limited to hexamethyldisilazane (HMDS).

Similarly, while the preferred embodiment of the present invention illustrates the present invention within the context of a diode formed employing the doped region 12 of a P+ dopant polarity in conjunction with the semiconductor substrate 10 of an N− polarity, where the doped region 12 in turn has formed thereupon the first bond pad 16a and the semiconductor substrate 10 at a location other than the doped region 12 has formed thereupon the second bond pad 16b, a reverse ordering of the dopant polarities of the doped region 12 and the semiconductor substrate 10 will typically lead to enhanced corrosion of the second bond pad 16b in comparison with the first bond pad 16a. Similarly, within the context of the present invention, other optoelectronic devices which need not necessarily be bipolar junction photodiodes (and in particular other optoelectronic devices of increased junction area) formed within the context of the preferred embodiment of the present invention, may also benefit from the present invention.

In that regard, it has also been observed that an optoelectronic device comprising: (1) a P+ doped region formed within a larger P− doped region in turn formed within an N-substrate; (2) a P+ doped region formed within a larger P− doped region in turn formed within a P-substrate; (3) a P+ doped region formed within a P-substrate; or (4) a P− doped region formed within a P— substrate, where a bond pad is formed upon the most heavily doped P+ region, are also susceptible to corrosion of the bond pad when irradiating the optoelectronic device with optoelectronically transducable radiation. Thus, it appears that both bipolar junction photodiodes and homopolar junction optoelectronic microelectronic devices which are formed employing a most highly doped P+ doped region will in general benefit from the present invention. Similarly, it is also expected that optoelectronic microelectronic devices formed employing photoconductor materials such as but not limited to cadmium sulfide, zinc sulfide and indium antimonide, will also benefit from the present invention.

EXAMPLES

Three arsenic doped N− silicon semiconductor substrates were obtained. There was then formed via an ion implantation method employing a boron dopant a series of P+ doped regions into each of the three N− silicon semiconductor substrates, thus forming within the three silicon semiconductor substrates three series of photodiodes.

There was then formed offset upon each of the ion implanted doped regions a series of bond pads formed from a series of patterned aluminum containing conductor layers of a real dimensions about 80 by about 80 microns and thickness about 15000 angstroms.

Finally, there was then formed over each of the semiconductor substrates a patterned passivation dielectric layer having formed therethrough a series of vias which accessed the series of bond pads.

A first of the three semiconductor substrates received no additional processing.

A second of the three semiconductor substrates was then subjected to: (1) immersion in an alkali photoresist developer solution at a temperature of about 25 degrees centigrade for a time period of about 3 minutes, followed by; (2) a deionized water rinsing and drying, for a total of six repetitive process cycles. Immersion in the photoresist developer solution was undertaken in the presence of ambient light.

A third of the three semiconductor substrates was treated analogously with the second of the three semiconductor substrates, but in darkness, rather than the presence of the ambient light.

A corroded bond pad count and a bond wire strength were then measured for the bond pads formed upon the doped regions formed within the three semiconductor substrates. The results are reported within Table I as follows. The results were obtained while employing physical inspection methods and wire bonding methods as are conventional in the art of optoelectronic microelectronic fabrication.

TABLE I

| Bond Pad Processing | | | |
| --- | --- | --- | --- |
|  | None | P/R Dev in Light | P/R Dev in Dark |
| Corroded Bond Pad Count (absolute) | 0 | 662 | 0 |
| Bond Wire Strength (grams) | 45 | 20 | 41 |

As is seen from review of the data within Table I, by developing a photoresist material from the vicinity of a bond pad within an optoelectronic microelectronic fabrication in absence of light, the bond pad is provided with more uniform and superior physical properties.

As is understood by a person skilled in the art, the preferred embodiment and examples of the present invention are illustrative of the present invention rather than limiting of the present invention. Revisions and modifications may be made to methods, materials, structures and dimensions for forming an optoelectronic microelectronic fabrication in accord with the preferred embodiment and examples of the present invention, while still providing an optoelectronic microelectronic fabrication in accord with the present invention, as defined by the accompanying claims.

What is claimed is:

1. A method for fabricating a microelectronic fabrication comprising:

providing a substrate employed within an optoelectronic microelectronic fabrication, the substrate comprising an optoelectronic microelectronic device electrically connected with a bond pad formed over the substrate;

forming and photoexposing over optoelectronic microelectronic device and the bond pad a photoresist layer; and developing the photoresist layer in the absence of optoelectronically transducable radiation, in order to attenuate corrosion of the bond pad.

2. The method of claim 1 wherein the optoelectronic microelectronic fabrication is selected from the group consisting of solar cell optoelectronic microelectronic fabrications, sensor optoelectronic microelectronic fabrications and display optoelectronic microelectronic fabrications.

3. The method of claim 1 wherein the optoelectronic microelectronic device is selected from the group consisting of bipolar junction photodiode optoelectronic microelectronic devices, homopolar junction optoelectronic microelectronic devices and optoelectronic microelectronic devices formed employing photoconductor materials.

4. The method of claim 1 wherein the bond pad is formed from a conductor material selected from the group consisting of metals, metal alloys, doped polysilicon and polycide conductor materials.

5. The method of claim 1 wherein the photoresist layer is developed in an alkali photoresist developer.

6. A method for fabricating a microelectronic fabrication comprising:

providing a substrate employed within an image array optoelectronic microelectronic fabrication, the substrate comprising an optoelectronic microelectronic device electrically connected with a bond pad formed over the substrate;

forming and photoexposing over the optoelectronic microelectronic device and the bond pad a photoresist layer; and developing the photoresist layer in the absence of optoelectronically transducable radiation, in order to attenuate corrosion of the bond pad.

7. The method of claim 6 wherein the image array optoelectronic microelectronic fabrication is selected from the group consisting of sensor image array optoelectronic microelectronic fabrications and display image array optoelectronic microelectronic fabrications.

8. The method of claim 6 wherein the image array optoelectronic microelectronic fabrication is a color filter sensor image array optoelectronic microelectronic fabrication.

9. The method of claim 6 wherein the optoelectronic microelectronic device is selected from the group consisting of bipolar junction photodiode optoelectronic microelectronic devices, homopolar junction optoelectronic microelectronic devices and optoelectronic microelectronic devices formed employing photoconductor materials.

10. The method of claim 6 wherein the optoelectronic microelectronic device comprises a P+ doped region electrically connected with the bond pad.

11. The method of claim 6 wherein the bond pad is formed from a conductor material selected from the group consisting of metals, metal alloys, doped polysilicon and polycide conductor materials.

12. The method of claim 6 wherein the bond pad is formed of an aluminum containing conductor material.

13. The method of claim 6 wherein the photoresist layer is developed in an alkali photoresist developer.

14. The method of claim 8 wherein the photoresist layer is developed to form a patterned color filter layer within the color filter sensor image array optoelectronic microelectronic fabrication.

* * * * *